United States Patent
Su et al.

(10) Patent No.: US 9,116,665 B2
(45) Date of Patent: Aug. 25, 2015

(54) MODULAR PROTECTIVE COVER WITH ACCESSORY SLOT FOR PORTABLE ELECTRONIC DEVICE

(75) Inventors: Yi-Chieh Su, Chino, CA (US); Hong Lip Yow, Chino, CA (US); John Chi, Corona, CA (US)

(73) Assignee: AFC TRIDENT, INC., Ontario, CA (US)

( * ) Notice: Subject to any disclaimer, the term of this patent is extended or adjusted under 35 U.S.C. 154(b) by 0 days.

(21) Appl. No.: 13/270,163

(22) Filed: Oct. 10, 2011

(65) Prior Publication Data

US 2013/0088813 A1  Apr. 11, 2013

(51) Int. Cl.
| | | |
|---|---|---|
| G06F 1/16 | (2006.01) | |
| H05K 5/00 | (2006.01) | |
| H05K 7/00 | (2006.01) | |
| F16M 11/04 | (2006.01) | |
| H05K 5/02 | (2006.01) | |

(52) U.S. Cl.
CPC ............ G06F 1/1628 (2013.01); *F16M 11/041* (2013.01); *H05K 5/0217* (2013.01); *Y10T 29/49826* (2015.01)

(58) Field of Classification Search
CPC ........ G06F 1/1626; G06F 1/166; H04M 1/04; F16M 11/10; F16M 11/041; H05K 5/0217
USPC ............ 455/575.8, 575.1, 575.4; 361/679.34, 361/679.55, 679.56, 679.01; 206/320; 220/4.02; 248/688; 174/50
See application file for complete search history.

(56) References Cited

U.S. PATENT DOCUMENTS

| | | | | |
|---|---|---|---|---|
| 5,568,357 | A * | 10/1996 | Kochis et al. ............ | 361/679.26 |
| 5,732,928 | A * | 3/1998 | Chang ........................... | 248/688 |
| 6,768,635 | B2 * | 7/2004 | Lai et al. .................. | 361/679.11 |
| 6,971,622 | B2 * | 12/2005 | Ziegler et al. ................ | 248/454 |
| 6,975,507 | B2 * | 12/2005 | Wang et al. .............. | 361/679.21 |
| 7,001,088 | B2 * | 2/2006 | Hui-hu .......................... | 400/681 |
| 7,364,009 | B2 * | 4/2008 | Sperle et al. ................. | 181/150 |
| D575,056 | S * | 8/2008 | Tan ............................... | D3/218 |
| 7,933,122 | B2 | 4/2011 | Richardson | |
| 8,253,595 | B2 * | 8/2012 | Yang et al. ...................... | 341/20 |
| 8,342,325 | B2 * | 1/2013 | Rayner ......................... | 206/320 |
| 8,624,111 | B2 * | 1/2014 | Tages et al. ..................... | 174/50 |
| 2002/0101707 | A1 * | 8/2002 | Canova et al. ................ | 361/683 |
| 2006/0279924 | A1 * | 12/2006 | Richardson et al. .......... | 361/683 |
| 2007/0139873 | A1 | 6/2007 | Thomas et al. | |
| 2007/0217135 | A1 * | 9/2007 | Chuang et al. ................ | 361/681 |
| 2007/0297149 | A1 | 12/2007 | Richardson et al. | |
| 2008/0230437 | A1 * | 9/2008 | Ou et al. ........................ | 206/701 |
| 2008/0251512 | A1 * | 10/2008 | Griffin et al. ................. | 220/4.02 |
| 2009/0017883 | A1 * | 1/2009 | Lin ............................ | 455/575.8 |
| 2009/0181729 | A1 * | 7/2009 | Griffin et al. .............. | 455/575.1 |
| 2010/0008028 | A1 | 1/2010 | Richardson et al. | |
| 2010/0072334 | A1 * | 3/2010 | Le Gette et al. ........... | 248/176.3 |
| 2010/0096284 | A1 * | 4/2010 | Bau ............................... | 206/320 |
| 2010/0147737 | A1 | 6/2010 | Richardson et al. | |

(Continued)

*Primary Examiner* — Adrian S Wilson
*Assistant Examiner* — Abhishek Rathod
(74) *Attorney, Agent, or Firm* — Konrad Raynes Davda & Victor LLP; David W. Victor

(57) ABSTRACT

A protective cover for a portable electronic device that includes a main body portion that is adapted to at least partially surround and enclose a portable electronic device. The main body portion includes a rear section that has an accessory slot defined therein. The accessory slot removably receives an accessory assembly that includes a base having an accessory mounted thereto.

18 Claims, 10 Drawing Sheets

(56) References Cited

U.S. PATENT DOCUMENTS

| | | |
|---|---|---|
| 2011/0073608 A1 | 3/2011 | Richardson et al. |
| 2011/0228458 A1* | 9/2011 | Richardson et al. ..... 361/679.01 |
| 2011/0228459 A1 | 9/2011 | Richardson et al. |
| 2011/0266291 A1* | 11/2011 | Fan ............................ 220/669 |
| 2012/0018323 A1* | 1/2012 | Johnson et al. ............... 206/320 |
| 2012/0074005 A1 | 3/2012 | Johnson et al. |
| 2012/0168336 A1* | 7/2012 | Schmidt et al. ............... 206/478 |
| 2012/0261306 A1 | 10/2012 | Richardson et al. |
| 2012/0327565 A1* | 12/2012 | Tages et al. .............. 361/679.01 |

* cited by examiner

MODULAR PROTECTIVE COVER WITH ACCESSORY SLOT FOR PORTABLE ELECTRONIC DEVICE

FIELD OF THE INVENTION

This invention is directed to a protective cover for a portable electronic device and more particularly to a modular protective cover with an accessory slot for a portable electronic device.

BACKGROUND OF THE INVENTION

Over the past decade or so, mobile phones have become ubiquitous and are almost a necessity. Therefore, the protection of mobile phones from damage has become important. In particular, many people drop and break there phones, which causes them to have to spend money to buy a new phone. Accordingly, covers and the like for protecting mobile phones have become popular. For example, see U.S. Pat. No. 7,933,122, issued on Apr. 26, 2011, the entirety of which is incorporated herein by reference. Furthermore, mobile phones are often used for more than telephone calls. For example, mobile phones can be used for GPS navigation, viewing movies and playing video games, etc. Accessories that make such uses easier are desirable.

SUMMARY OF THE PREFERRED EMBODIMENTS

In accordance with one aspect of the present invention, there is provided a protective cover for a portable electronic device that includes a main body portion that is adapted to at least partially surround and enclose a portable electronic device. The main body portion includes a rear section that has an accessory slot defined therein. The accessory slot removably receives an accessory assembly that includes a base having an accessory mounted thereto.

In a preferred embodiment, the rear section includes a first set of two receiving openings defined therein that are positioned on opposite sides of the accessory slot that receive first and second tabs that extend outwardly from opposite sides of the base. Preferably, the receiving openings each include a first portion and a second portion. The first and second tabs on the base define a first width from the outer edge of the first tab to the outer edge of the second tab, the first portions define a second width from the outer edge of the first portion on one side of the accessory slot to the outer edge of the first portion on the opposite side of the accessory slot, and the second portions define a third width from the outer edge of the second portion on one side of the accessory slot to the outer edge of the second portion on the opposite side of the accessory slot. The second width is wider than the first width and the third width is narrower than the first width, such that the first and second tabs can be inserted into the first portions and slid into the second portions and under the rear section.

In a preferred embodiment, the accessory slot includes one of a ridge or a groove and the base includes the other of a ridge or a groove. The ridge is received in the groove to secure the base within the accessory slot. Preferably, the rear section includes a second set of two receiving openings defined therein that are positioned on opposite sides of the accessory slot. The second set of receiving openings are adapted to receive the first and second tabs that extend outwardly from opposite sides of the base, such that the accessory assembly is reversible. In a preferred embodiment, the accessory is selected from the group consisting of a kickstand, bicycle handlebar mounting assembly, tripod mounting assembly and windshield mounting assembly.

In accordance with another aspect of the present invention, there is provided a protective cover for a portable electronic device that includes an inner cushion enclosure adapted to at least partially surround and enclose a portable electronic device and a front shell that is received on and secured to the inner cushion enclosure. The inner cushion enclosure includes a back wall, two side walls, a top pouch and a bottom pouch that all cooperate to define an interior and a front screen opening. The top pouch and the bottom pouch include a groove defined in an outside surface thereof. The front shell includes a front section that has a front screen opening defined therein and rearwardly extending top and bottom members. The top member includes a hook portion that is removably received in the groove in the top pouch and the bottom member includes a hook portion that is removably received in the groove in the bottom pouch.

In a preferred embodiment, the protective cover further includes a back shell that includes a rear section and two forwardly extending side members that are removably secured to the front section of the front shell. Preferably, the front section of the front shell includes at least two grooves defined therein and the side members of the back shell each include at least one tab disposed thereon. The grooves of the front shell cooperate with the tabs of the back shell to secure the back shell to the front shell. In a preferred embodiment, the top and bottom members of the front shell include grooves defined therein that cooperate with tabs disposed on the rear section of the back shell to secure the back shell to the front shell. In a preferred embodiment, the rear section of the back shell has an accessory slot defined therein that removably receives a base having an accessory mounted thereto.

In accordance with another aspect of the present invention, there is provided a method of assembling a protective cover for a portable electronic device. The method includes the steps of purchasing an inner cushion enclosure made of a relatively flexible material that includes a back wall, two side walls, a top pouch and a bottom pouch that all cooperate to define an interior and a front screen opening, covering the portable electronic device with the inner cushion enclosure, purchasing a front shell that is made of a relatively hard material, and securing the front shell to the inner cushion enclosure. In a preferred embodiment, the method further includes the steps of purchasing a back shell that is made of a relatively hard material, and securing the back shell to the front shell.

Preferably, the top pouch and the bottom pouch of the inner cushion enclosure each include a groove defined in an outside surface thereof and the front section of the front shell has a front screen opening defined therein and rearwardly extending top and bottom members that each include a hook portion. The method further includes inserting the hook section of the top member into the groove in the top pouch and inserting the hook section of the bottom member into the groove in the bottom pouch. In a preferred embodiment, the rear section of the back shell includes two forwardly extending side members that each include at least one tab disposed thereon, and the front section of the front shell includes at least two grooves defined therein. The method further includes inserting the tabs into the grooves to secure the back shell to the front shell. Preferably, the back shell includes a rear section that has an accessory slot defined therein, and the method further includes inserting an accessory assembly into the accessory slot.

Other features and advantages of the present invention will become apparent to those skilled in the art from the following detailed description. It is to be understood, however, that the detailed description of the various embodiments and specific examples, while indicating preferred and other embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which.

Like numerals refer to like parts throughout the several views of the drawings.

DETAILED DESCRIPTION

Figure 1:
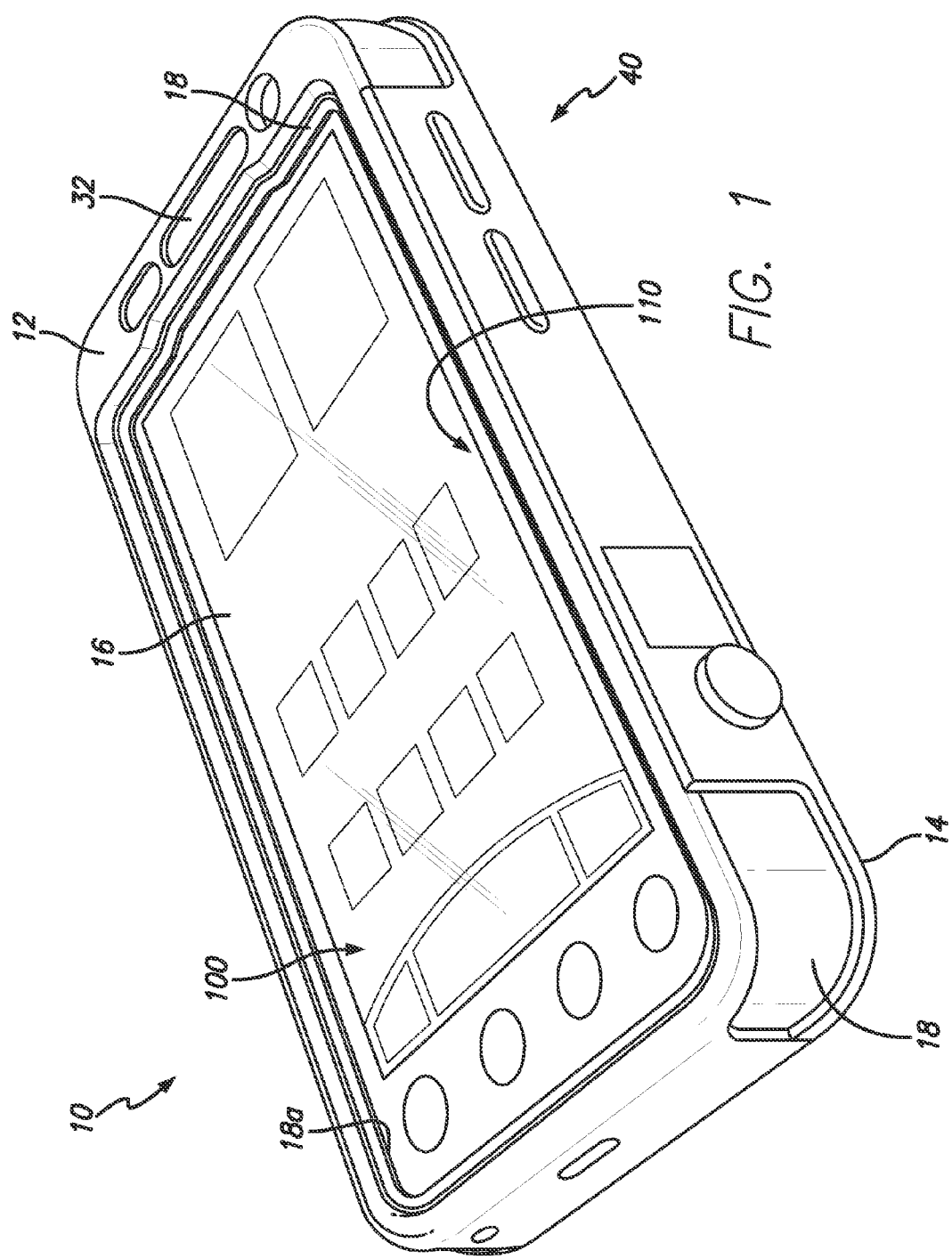
FIG. 1 is a perspective view of a modular protective cover assembly for a portable electronic device disposed on a mobile phone in accordance with an embodiment of the present invention.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are references to the same embodiment; and, such references mean at least one of the embodiments.

Reference in this specification to "one embodiment" or "an embodiment" means that a particular feature, structure, or characteristic described in connection with the embodiment is included in at least one embodiment of the-disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks: The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein. Nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

It will be appreciated that terms such as "front," "back," "top," "bottom," "left," "right," "above," and "side" used herein are merely for ease of description and refer to the orientation of the components as shown in the figures. It should be understood that any orientation of the components described herein is within the scope of the present invention.

As shown in FIGS. 1-13, the present invention is preferably directed to a modular protective cover assembly 10 for a hand-held electronic device or the like. In the figures, the hand-held electronic device is a mobile phone 100. However, this is not a limitation on the present invention and the protective cover assembly 10 can be used with any type of portable electronic device, including personal digital assistants (PDAs), computers, tablets, notebooks, smartphones, mobile phones, satellite phones, cellular phones, pagers, music players, MP3 players, media players, digital cameras, video cameras, global positioning system devices (GPS), portable game consoles and the like.

In a preferred embodiment, as shown in FIG. 1, the assembly 10 generally includes a front shell 12, a back shell 14, and an inner cushion enclosure 18. Generally, the phone 100 is enclosed within the cushion enclosure 18 so that the screen 110 (and the keyboard, if present) of the phone are exposed through a screen opening 18a in the cushion enclosure 18.

The front and back shells 12 and 14 are secured over the cushion enclosure 18 to form the protective cover assembly 10, as is shown in FIG. 1. When fully assembled, the protective cover assembly at least partially and substantially surrounds and provides protection for phone 100.

Figure 2:
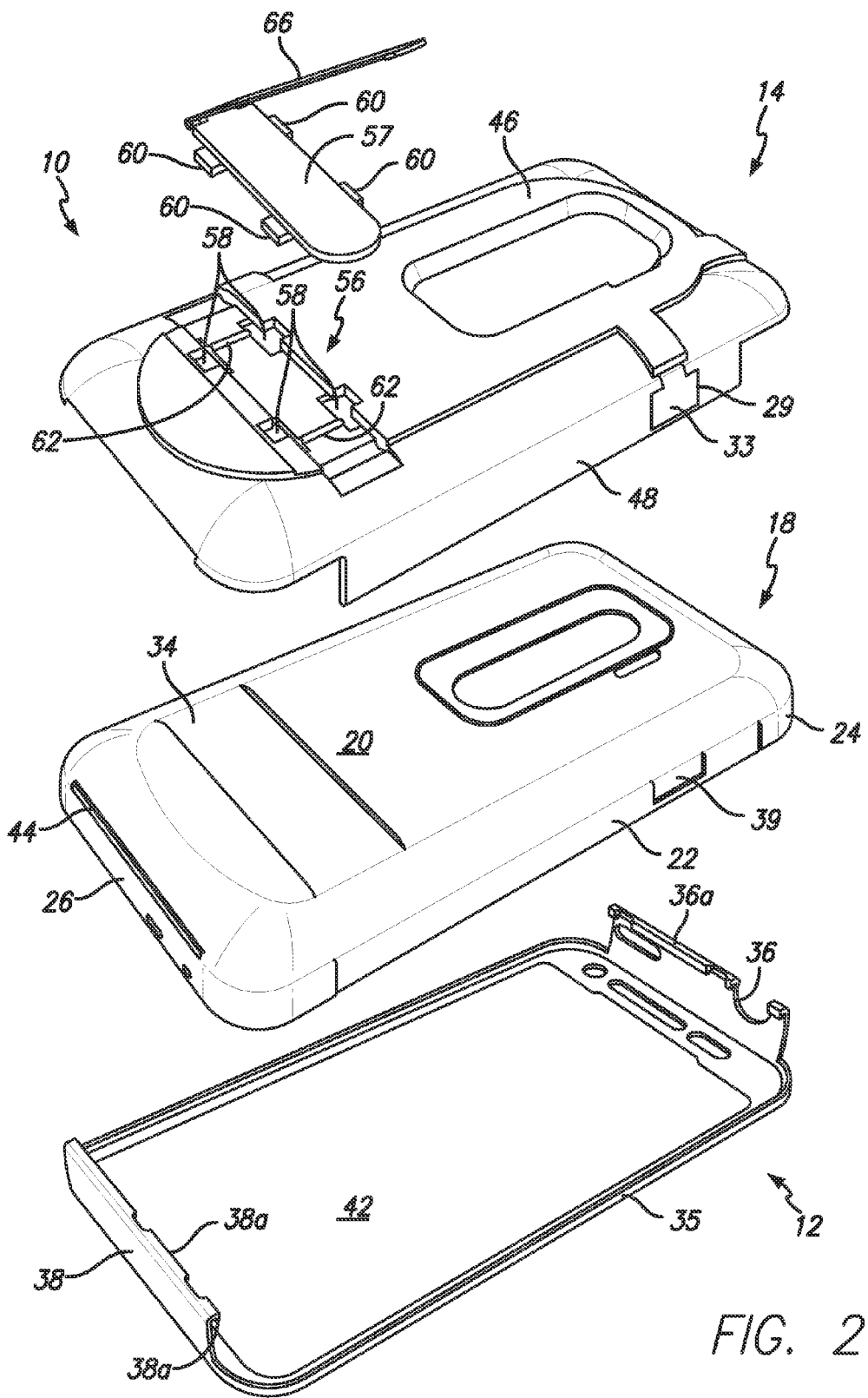
FIG. 2 is an exploded rear perspective view of the modular protective cover assembly of FIG. 1.
Figure 3:
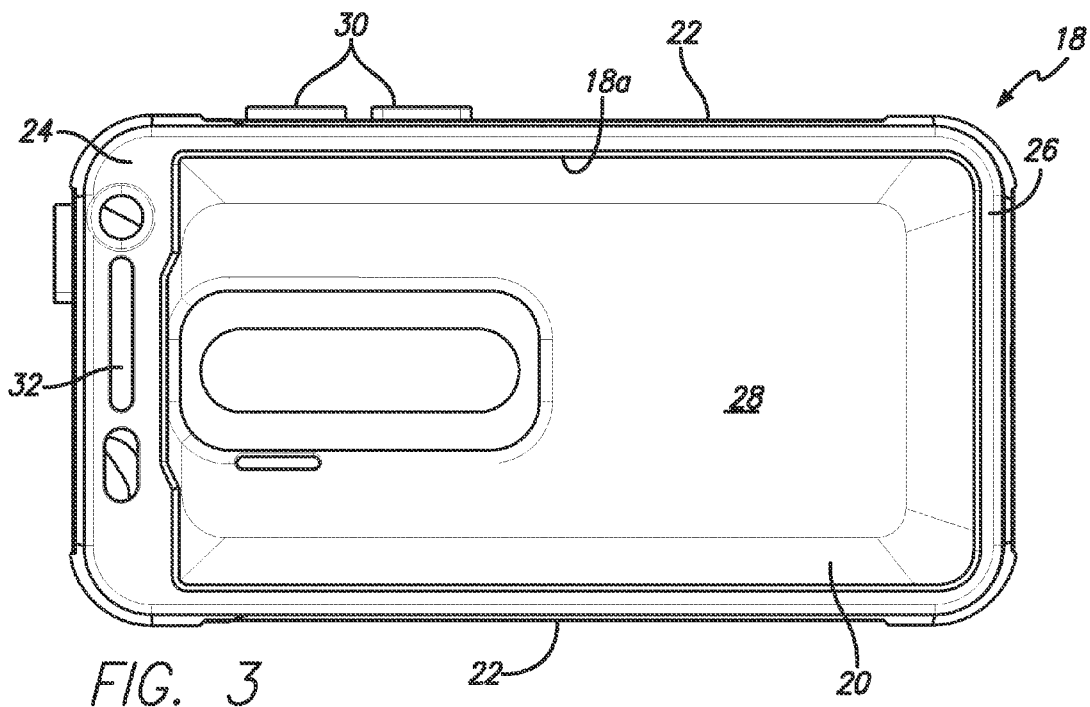
FIG. 3 is a front elevational view of the inner cushion enclosure of the modular protective cover assembly of FIG. 1.
Figure 4:
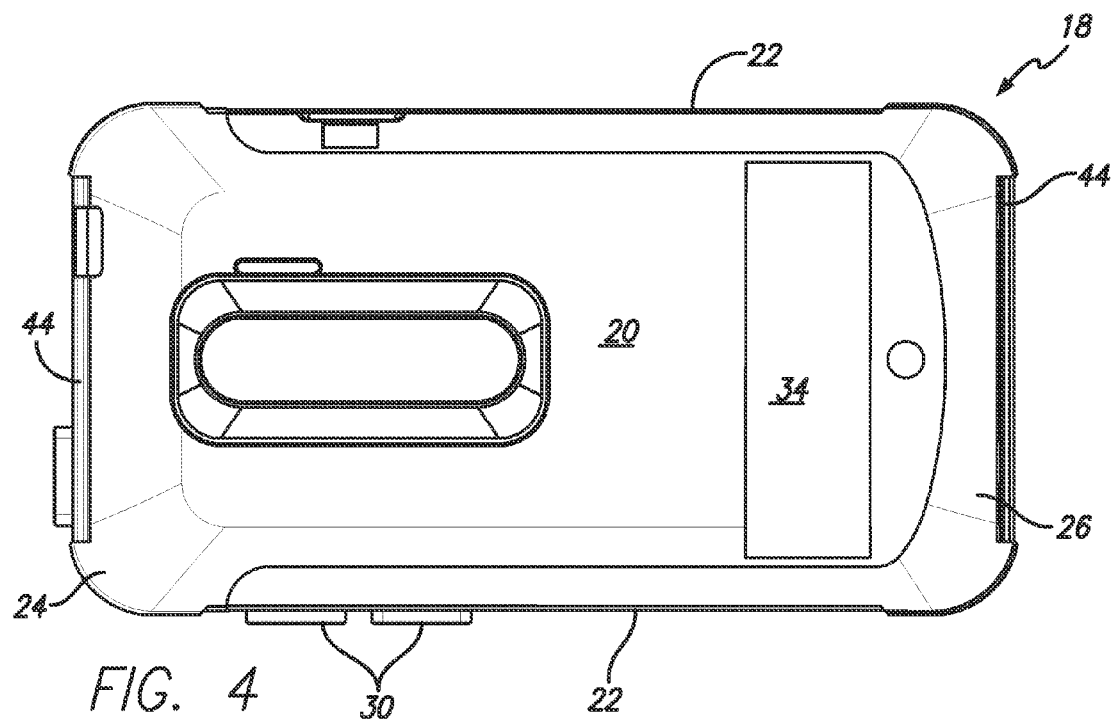
FIG. 4 is a rear elevational view of the inner cushion enclosure of the modular protective cover assembly of FIG. 1.

As shown in FIGS. 2-4, in a preferred embodiment, the cushion enclosure 18 is made of a relatively flexible material such as a thermoplastic, rubber, silicon, urethane, or other material that is capable of stretching sufficiently to allow the phone 100 fit inside of the cushion enclosure 18. The cushion enclosure 18 generally includes a back wall 20, two side walls 22, a top pouch 24 and a bottom pouch 26 that all cooperate to define an interior 28 that receives the phone 100 and provides cushioning in a drop situation and fits snugly over the phone 100. As shown best in FIG. 2, the cushion enclosure 18 includes an accessory recess 34, the purpose of which will be described below. It will be understood that the top and bottom pouches 24 and 26 can just be walls that cover the bottom and top of the phone.

It will be understood that the protective cover assembly 10 can be modified for different phone models and other portable electronic device models. Accordingly, the cushion enclosure 18 may include pads that are a part of or are connected to the cushion enclosure 18 to allow actuation of switches, buttons or the like that are on the phone 100. The pads can then be depressed by a user to activate a tilt switch or push button switch, such as pads 30 that are positioned to allow a user to operate switches on the phone 100. In another embodiment, the pads can be omitted and an opening can allow access to buttons or switches on the phone. Other pads or openings (such as speaker opening 32 and charger opening 39) can also be incorporated in the stretchable cushion layer that allow a user to interface with various controls on the phone 100.

Preferably, the front and back shells 12 and 14 are made of a relatively hard material, such as an ABS material, propylene, a polycarbonate, thermoplastics, metals, composite materials, and other rigid materials used in injection molding and the like. It will be understood that assembly 10 can be used and designed differently for different types of phones or similar devices. Accordingly, front and back shells 12 and 14 can include different openings, slots, etc. for access to buttons, switches, cameras and the like on different phones.

Figure 7:
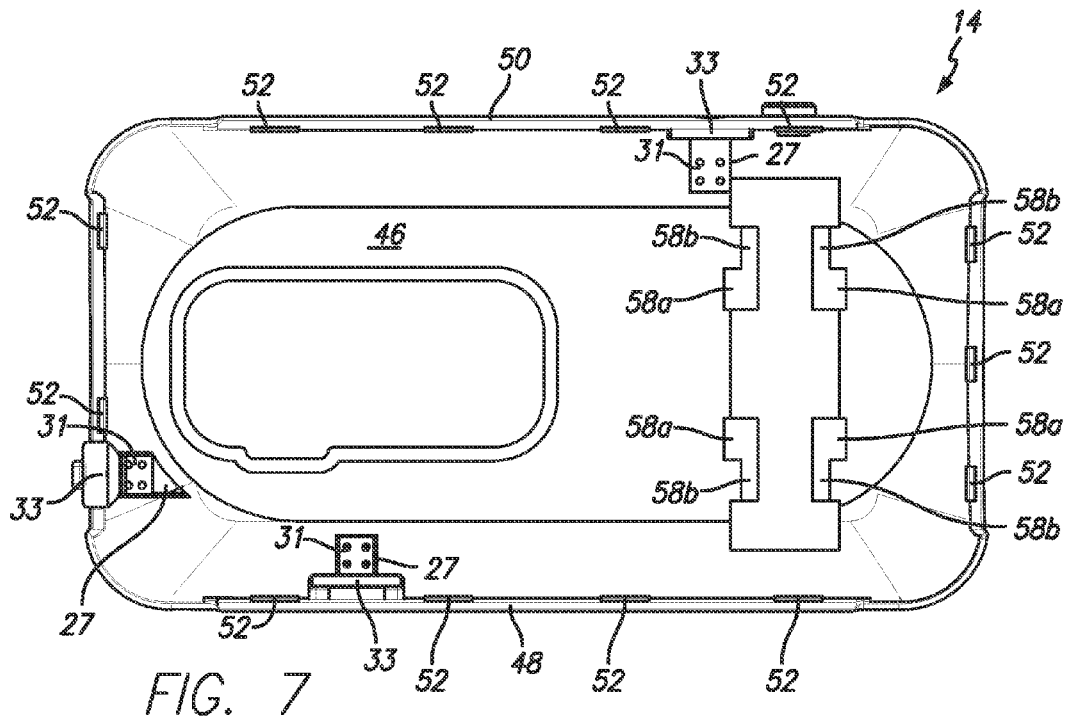
FIG. 7 is a front elevational view of the back shell of the modular protective cover assembly of FIG. 1.

In a preferred embodiment, the back shell 14 includes "soft components" that are made of a similar material to the cushion enclosure 18. These components can be glued to the back shell 14 and used to plug, fill or cover openings in the back shell 14 to protect openings in the phone 100 (such as the charger opening or other mini or micro USB openings, or a multi-media opening, etc.). For example, as shown in FIG. 7, the back shell 14 can include slots 27 and adjacent openings 29 defined therein for gluing or otherwise adhering tabs 31 that allow soft covers 33 to be pivotal within openings 29. In a preferred embodiment, the soft covers 33 are friction fit within openings 29. For example, in a preferred embodiment, back shell 14 includes a charger opening 29, which is covered by a pivotal cover 33, in the side 22 thereof that allows a charger to be inserted into the charging/docking port of phone 100.

Figure 9:
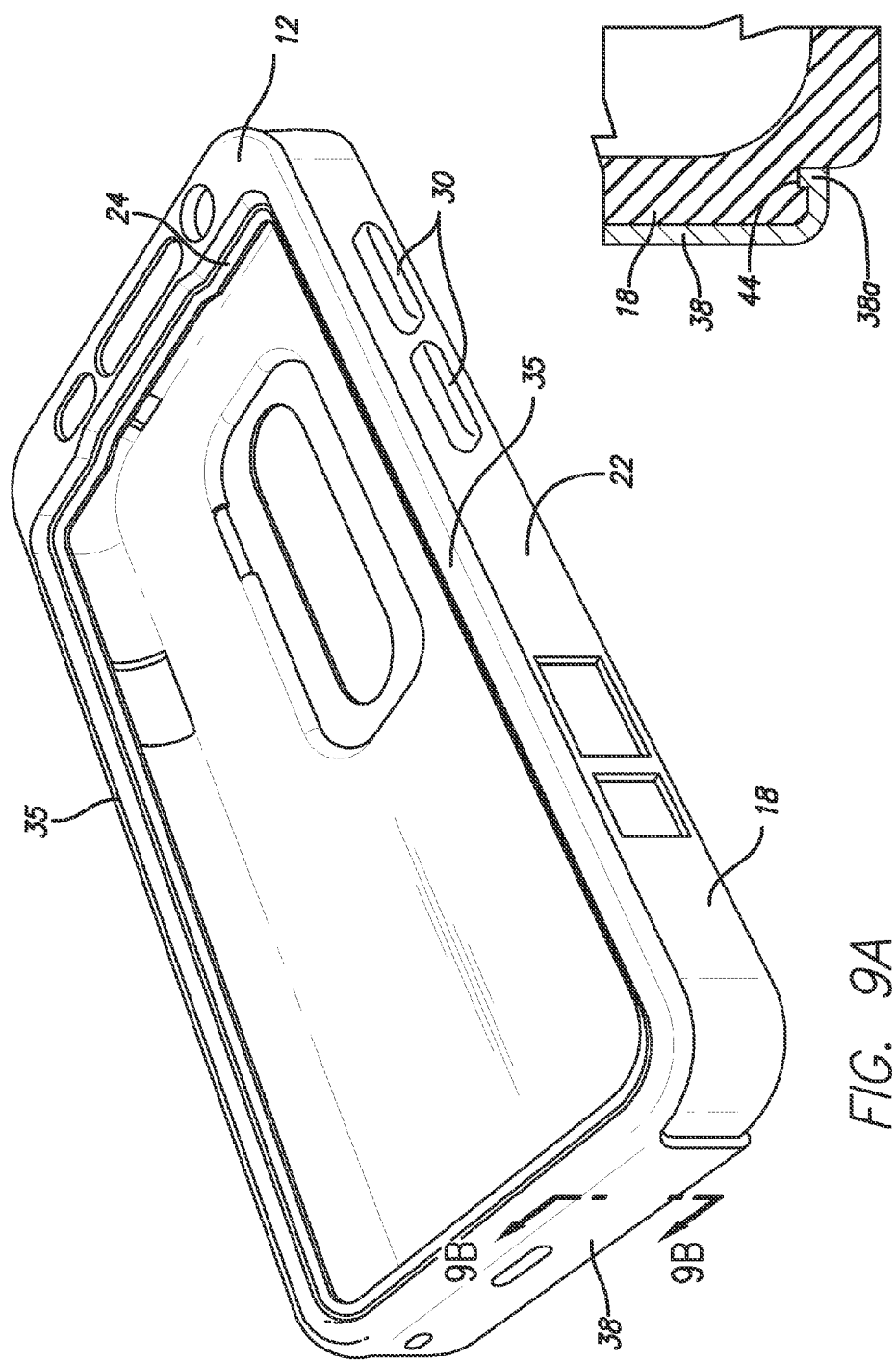
FIG. 9A is a rear perspective view of the modular protective cover assembly of FIG. 1 with a kickstand assembly in the accessory slot.
FIG. 9B is a cross-section of the kickstand assembly and accessory slot taken along line 9B-9B of FIG. 9A.
Figure 10:
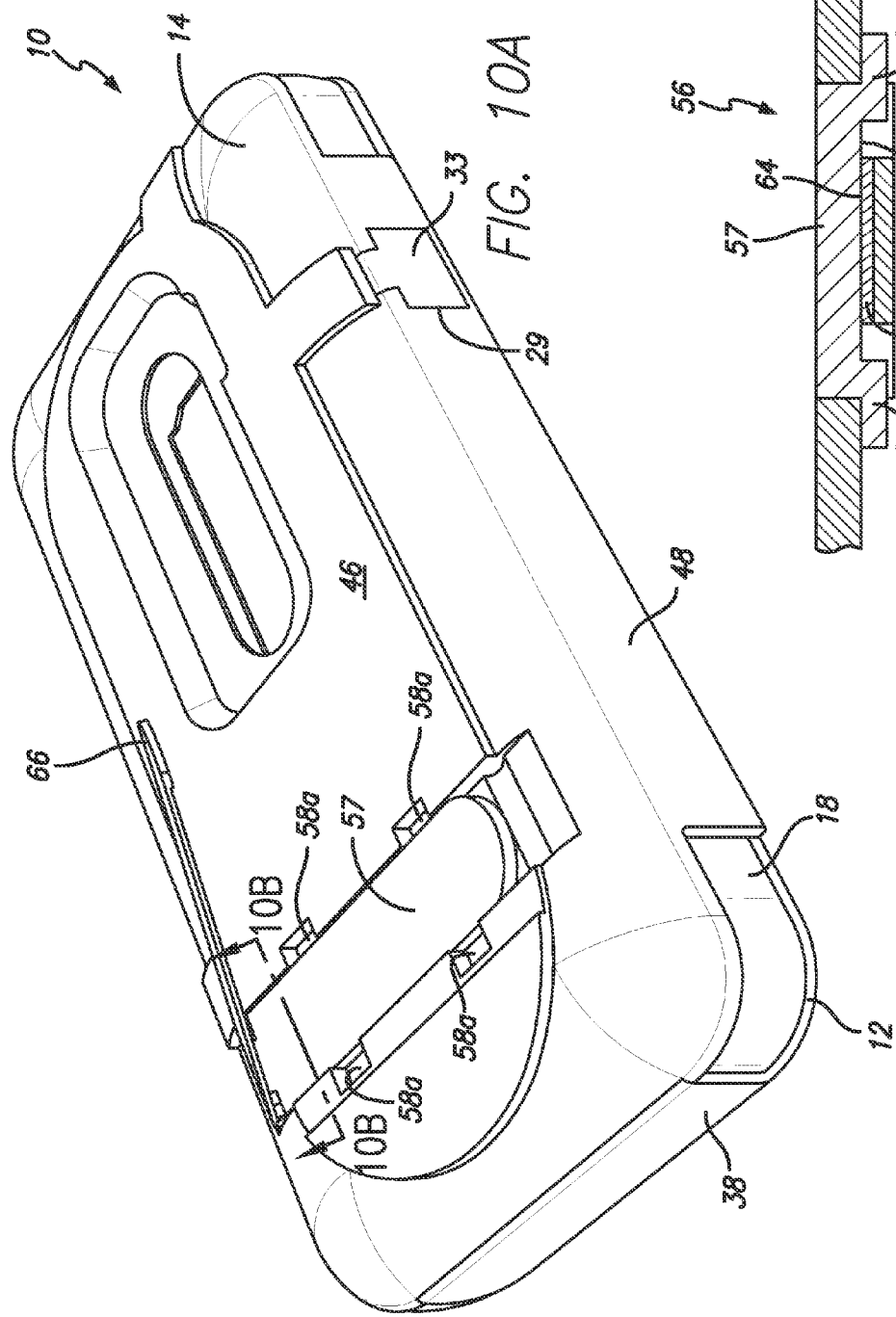
FIG. 10A is a rear perspective view of the modular protective cover assembly of FIG. 1 with a bicycle handlebar mounting assembly in the accessory slot.
FIG. 10B is a cross-section of the base and tabs mounted in the accessory slot taken along line 10B-10B of FIG. 10A.

In a preferred embodiment, the cushion enclosure 18, front shell 12 and back shell 14 are modular and sold separately. In other words, a user can purchase the cushion enclosure 18 by itself and use it to protect and enclose a phone. Then, if the user desires, he/she can purchase separately the front shell 12, which is designed to fit on and be retained by the cushion enclosure 18, as shown in FIG. 9. Lastly, the user can purchase separately the back shell 14, which is designed to connect with the front shell 12 to form the complete assembly 10. In this embodiment, the steps for forming the assembly 10 include purchasing the cushion enclosure 18, enclosing the phone in the cushion enclosure 18, purchasing the front shell 12, securing the front shell 12 on the cushion enclosure, purchasing the back shell 14, and securing the back shell 14 to the front shell 12 and over the cushion enclosure 18. It will be understood that in other embodiments the steps above can be rearranged. For example, the assembly 10 can be designed to allow the back shell 14 to fit on the cushion enclosure 18 first before securing the front shell 12 thereon. In another embodiment, the entire assembly 10 can be sold as a unit. In another embodiment, the user can purchase only the back shell 14 to cover a phone, or the front shell 12, to cover a phone.

The method of connecting the front and back shells 12 and 14 to one another or to the cushion enclosure 18 is not a limitation on the present invention. It may be done via snap fit, tabs, or other known methods. The assembly of the front shell 12 and back shell 14 form an assembled hard shell housing 40. It will be understood that housing 40 is preferably sized and shaped to form a rigid cover for the cushion enclosure 18.

Figure 5:
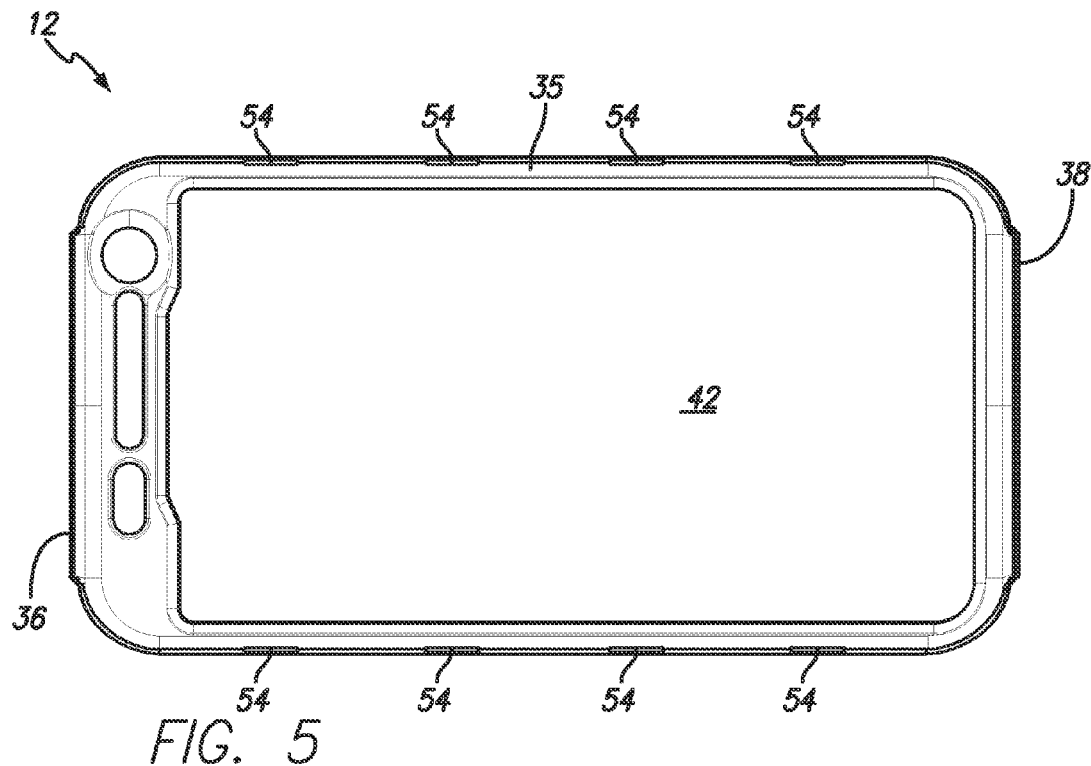
FIG. 5 is a front elevational view of the front shell of the modular protective cover assembly of FIG. 1.
Figure 6:
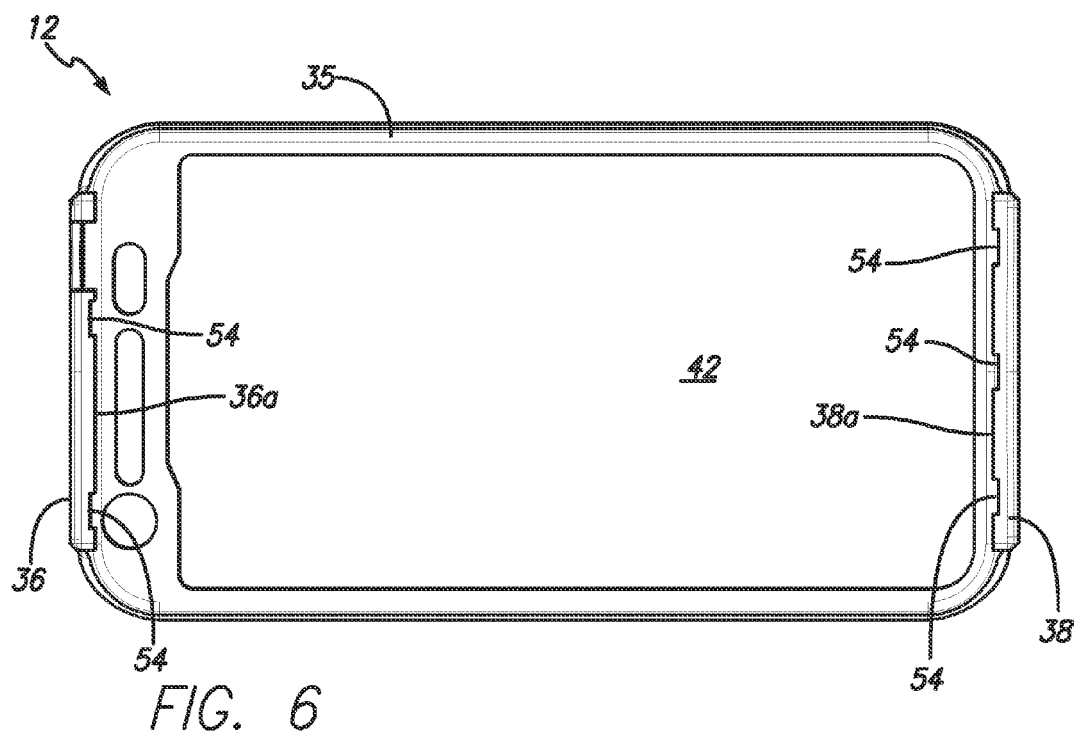
FIG. 6 is a rear elevational view of the front shell of the modular protective cover assembly of FIG. 1.

As is best shown in FIGS. 2 and 5-6, in a preferred embodiment, the front shell 12 includes a front section 35 (that includes a front opening 42 defined therein) and rearwardly extending top and bottom members 36 and 38, that cooperate to secure the front shell 12 onto the front of cushion enclosure 18. In a preferred embodiment, the top and bottom members 36 and 38 each include a hook portion 36a and 38a that is received in a groove 44 on the back 20 of the cushion enclosure 18. In another embodiment, there may be several separate hook portions that are received in a single groove 44 or separate grooves 44. In another embodiment, the front section 35 can include tabs, grooves or snaps that cooperate with corresponding features on the cushion enclosure 18, to help secure the front shell 12 to the cushion enclosure 18.

Figure 8:
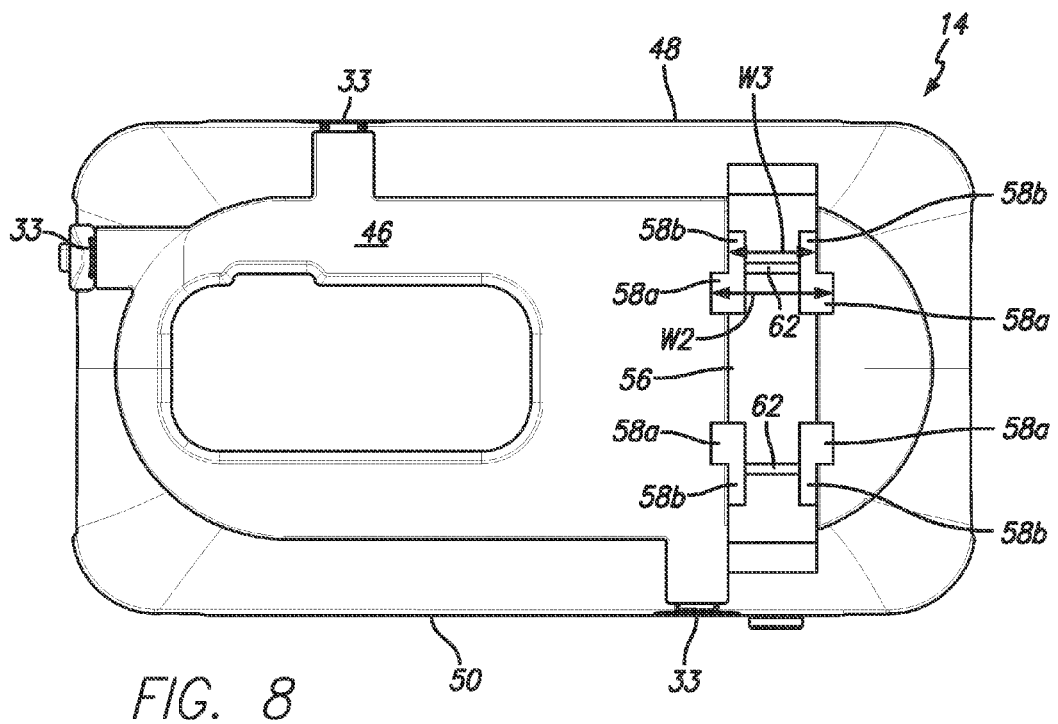
FIG. 8 is a rear elevational view of the back shell of the modular protective cover assembly of FIG. 1.

As is best shown in FIGS. 2 and 7-8, in a preferred embodiment, the back shell 14 includes a rear section 46 and two forwardly extending side members 48 and 50. In a preferred embodiment, the side members 48 and 50 include a series of tabs 52 thereon that cooperate with grooves 54 in the front section 35 of the front shell 14 to secure the back shell 12 to the front shell 14. In a preferred embodiment, the rear section 46 of the back shell 12 also include tabs 52 thereon that cooperate with grooves 54 in top and bottom members 36 and 38 of the front shell 14 to secure the back shell 12 to the front shell 14. In another embodiment, the tabs and grooves can be reversed.

In another embodiment, the cushion enclosure 18 can be made of a hard material, such as plastic or the like and the front and back shells 12 and 14 can be made of a relatively flexible material, such as silicon or rubber. In an embodiment, the cushion enclosure 18 and the front and back shells 12 and 14 can be made of the same material.

As shown in FIGS. 8-13, in a preferred embodiment, the back shell 14 includes an accessory slot 56. It will be understood that any number of accessories can be secured in the accessory slot 56 because the accessories are mounted on a base 57 that is received and secured in slot 56. In a preferred embodiment, the accessory slot 56 includes at least one set of receiving openings 58. In the embodiment shown in the figures, the slot 56 includes two sets of receiving openings 58 so that an accessory mounted in the slot 56 can be reversed as desired. As shown in FIG. 8, the first and second (or top and bottom) receiving openings 58 include a first portion 58a and a second portion 58b and are designed to receive tabs 60 that extend outwardly from the base 57 and more preferably from a bottom surface 57a of the base 57. It will be understood that with this arrangement, the first portion 58a is at a higher level than the second portion 58b, as is shown in FIG. 2, so that the tabs 60 can be slid under the rear section when they are slid into the second portions 58b.

As shown in FIGS. 8 and 10B, in a preferred embodiment, the tabs 60 on the base 57 define a first width W1 from the outer edge of one tab 60 to the outer edge of the other tab 60, the first portions 58a define a second width from the outer edge of the first portion 58a on one side of the accessory slot 56 to the outer edge of the first portion 58a on the opposite side of the accessory slot 56, and the second portions 58b define a third width W3 from the outer edge of the second portion 58b on one side of the accessory slot 56 to the outer edge of the second portion 58b on the opposite side of the accessory slot 56. Preferably, the second width W2 is wider than the first width W1 and the third width W3 is narrower than the first width W1. This allows the tabs 60 to be inserted into the first portions 58a and slid into the second portions 58b and under the rear section 46.

In a preferred embodiment, the accessory slot 56 includes a ridge 62 thereon that cooperates with a groove 64 in the bottom surface 57a of the base 57 to secure or lock the base 57 in place within accessory slot 56. In another embodiment, slot 56 can include multiple ridges and bottom surface 57a can include multiple grooves. In another embodiment, the ridge can be on the bottom surface 57a and the groove can be on the accessory slot 56. Other features for locking the base 57 in the accessory slot 56 are within the scope of the present invention. Furthermore, it will be understood that the accessory recess 34 in the cushion enclosure 18 receives the accessory slot 56 when the back shell 14 is secured on the cushion enclosure 18 and the accessory recess 34 allows the tabs 60 to slide along the second portion 58b.

FIGS. 10A and 10B show the accessory to be mounted in the accessory slot 56 as a kickstand 66 that is hingedly mounted on the base 57. FIG. 10B is a cross-section of just the base 57 and tabs 60 mounted in the accessory slot 56. To mount the kickstand 66 (the kickstand 66 together with the base 57 are referred to herein as a kickstand assembly), the tabs 60 are inserted into the first portions 58a in a first direction and are then slid or moved in a second direction (which is generally perpendicular to the first direction) until the ridge 62 is received in groove 64, thereby locking the base 57 in place. It will be appreciated by those skilled in the art that with this arrangement, the kickstand 66 and base 57 are removable so that another accessory can be positioned in the accessory slot 56 as desired.

Figure 11:
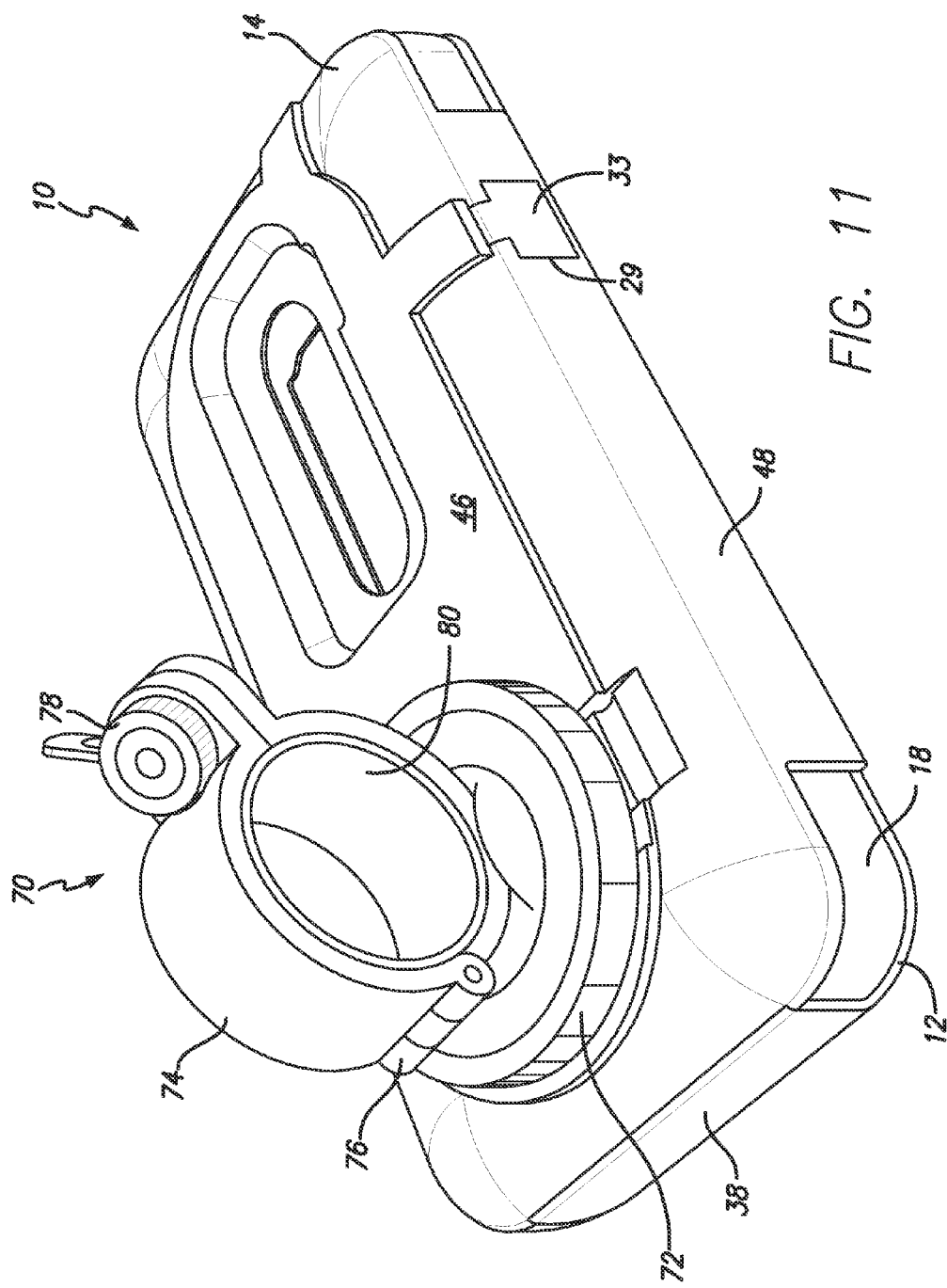
FIG. 11 is a rear perspective view of the modular protective cover assembly of FIG. 1 with a tripod mounting assembly in the accessory slot.

FIGS. 10A-13 include examples of other accessories that can be used in the accessory slot 56. It will be understood that each of these accessories include base 57 that allows the accessory to be docked with the accessory slot 56. FIG. 11 is a rear perspective view of the modular protective cover assembly 10 with a bicycle handlebar mounting assembly 70 in the accessory slot 56. Bicycle handlebar mounting assembly 70 can be used to secure a phone 100 and the protective cover assembly 10 to a handle bar or other tubular object so that a user can read maps, use GPS, when desired. The bicycle handlebar mounting assembly 70 generally includes base 57, a rotary dial 72, clamp 74, hinge 76, threaded fastener 78 and elastomeric gasket 80. The rotary dial 72 fastens the assembly 70 against back shell 14 and allows rotational adjustability. To secure the assembly 70 to a handlebar, threaded fastener 78 is unscrewed so that the two halves of clamp 74 can be hinged apart. The clamp 74 is then placed over a tube and the threaded fastener 78 is reinserted into a threaded opening (not shown) and the clamp 74 is tightened down to secure the assembly 70 (and phone and cover assembly 10) in place. The gasket 80 provides grip on the tube.

Figure 12:
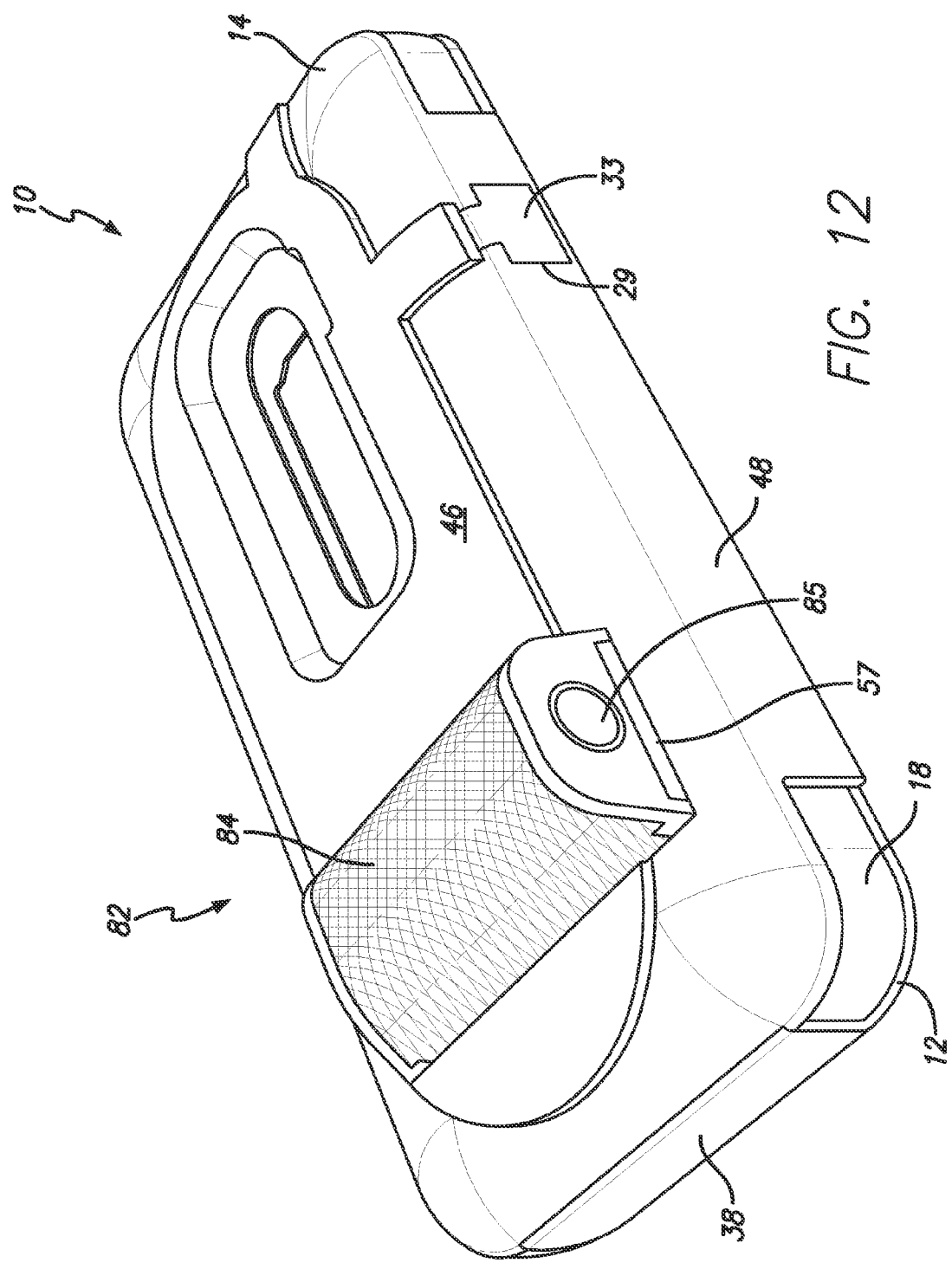
FIG. 12 is a rear perspective view of the modular protective cover assembly of FIG. 1 with a windshield mounting assembly in the accessory slot.

FIG. 12 is a rear perspective view of the modular protective cover assembly 10 with a tripod mounting assembly 82 in the accessory slot 56. Tripod mounting assembly 82 generally includes base 57, a handle 84 with a threaded female tripod connection receiving opening 85 therein. In a preferred embodiment, the handle 84 is knurled and includes a indentation where a user's fingers can be placed while taking a picture. Opening 85 can be used to mount the phone 100 and assembly 10 to a tripod or other object that includes a threaded male fastener.

Figure 13:
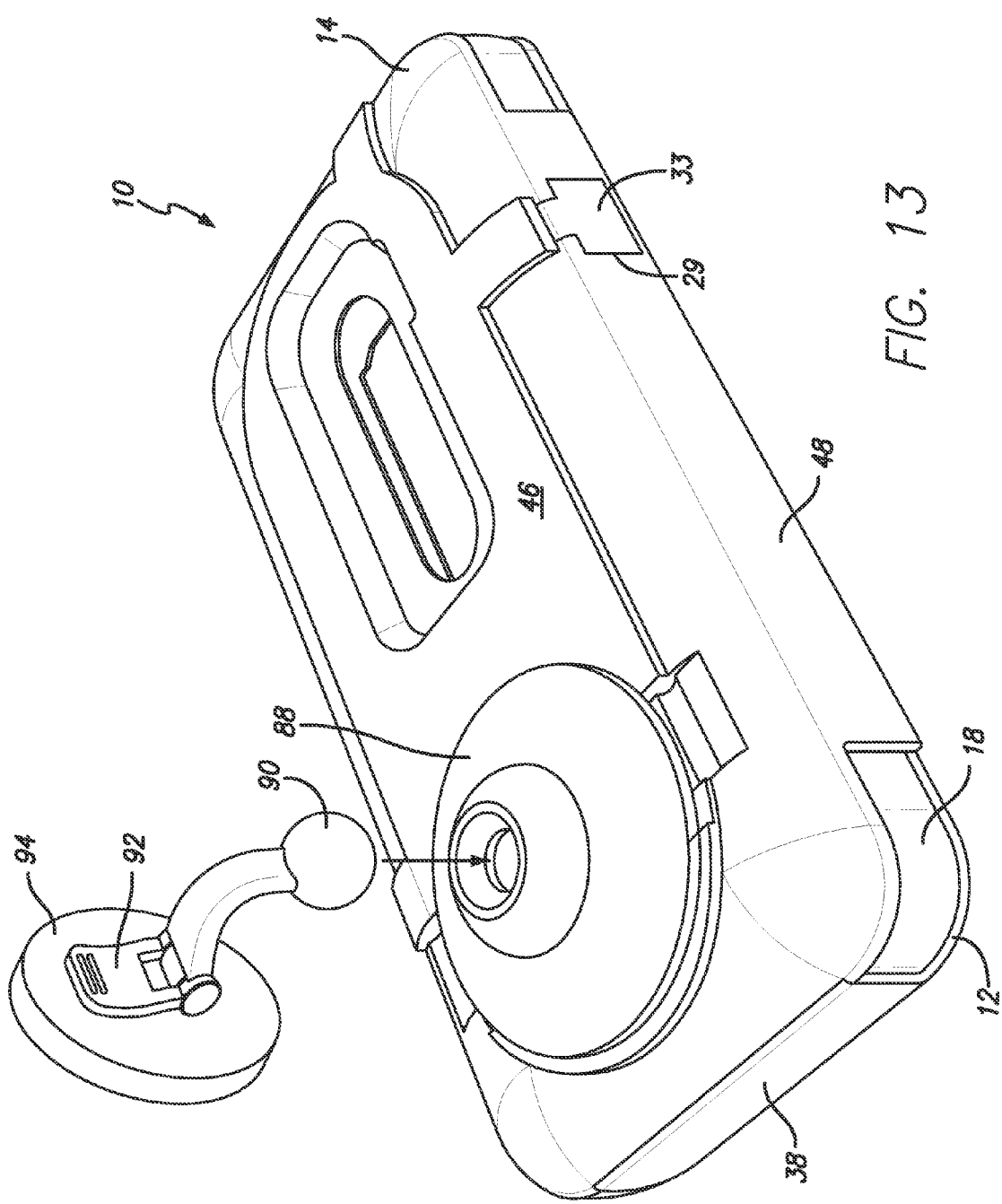
FIG. 13 is a rear perspective view of the modular protective cover assembly with a windshield/flat surface mounting assembly in the accessory slot.

FIG. 13 is a rear perspective view of the modular protective cover assembly 10 with a windshield/flat surface mounting assembly 86 in the accessory slot 56. The windshield/flat surface mounting assembly 86 generally includes base 57, a socket member 88, ball 90, latch 92 and suction cup 94. As is known in the art, ball 90 is received in socket member 88 and latch 92 is used to hingedly latch suction cup 94 to a windshield or the like. The arrangement of ball 90 and socket member 88 allows for pivotal adjustment of phone 100 and assembly 10.

The accessories described herein are not limitations on the present invention. Other accessories can be used in combination with base 57 and accessory slot 56. Other accessories, for example, may be a light, a magnet, a container, a cup holder, etc.

In a preferred embodiment, the back shell 14 and at least one accessory are sold as a kit. For example, the back shell 14 can be sold with the kickstand assembly. In another embodiment, the back shell 14 can be sold with more than one accessory. In another embodiment, assembly 10 can be sold with one or more assemblies.

In another embodiment, and as shown in FIG. 1, the assembly 10 can include a front cover portion 16 that covers and protects the screen 110 and any keys. The front cover portion 16 can be loose or secured to the inner surface of the front shell 12 such that it covers a screen opening 42 defined in the front shell 12 or secured in the inner cushion enclosure 18. However, this is not a limitation on the present invention. The front cover portion 16 can be made from a soft, plastic layer such as a soft, thin Lexan (polycarbonate), PVC, urethane, or silicon material that can be molded, such as by thermoforming, casting, stretching, heating, or injection molding, or otherwise shaped to fit to screen 110 of the phone 100 and/or other surfaces of the phone 100. The front cover portion 16 may be made from a single material or multiple materials that are welded, glued or formed together into a single sheet or membrane. For example, for the portion of the front cover portion 16 that is disposed over the display screen 110, it may be desirable to use a clear, thin, hard layer of glass or plastic to provide a clear, transparent material over the display screen that protects the display screen from scratches. The other part of the front cover portion 16 may be made of a thin layer of Lexan (polycarbonate), PVC or a silicon material that is flexible so that a keyboard and other buttons may be pressed through the screen protective portion 16.

In another embodiment for a phone with a keyboard, the front cover portion 16 may be made so that it is open to allow direct access to the keyboard, while the screen 110 is covered. In addition, various portions of the front cover portion 16 can be made clear, translucent, opaque or any desired color, or any combination of these alternatives. The front cover portion 16 is shown as covering a front portion of the phone 100, but can also be made to wrap around a portion of, or all of, the backside of the phone 100 and be at least partially sealed together, especially if a self-adhering material is used for the front cover portion 16. For example, if a camera is included on the backside of the phone 100, a clear portion of the front cover portion 16 can be used to cover a camera lens (not shown). The front cover portion 16 can also have some elasticity so that it fits tightly to the phone 100. The front cover portion 16 can be thermoformed or otherwise molded to fit the specific shape of all, or a portion of, the surfaces of the phone 100, to provide a tight, form fit to the phone 100. The molding or thermoforming process can be quickly and easily performed by simply generating a mold of the surfaces of the phone 100 to be covered and using that mold to generate a thermoforming mold or other mold. In this manner, a precisely formed membrane that fits tightly to the surfaces of the phone 100 can be simply and easily formed. Overlapping flaps (not shown) can also help to seal the membrane to the electronic device.

In a preferred embodiment, the molded, snug fit of the front cover portion 16 to the phone 100, as well as the tight fit of the cushion enclosure 18, front shell 12 and back shell 14 to the phone 100 and/or to each other, helps to seal the phone 100 within the protective cover assembly 10. Further, the tight fit of the stretchable cushion enclosure 18 also helps to keep water, dirt and dust out.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description of the Preferred Embodiments using the singular or plural number may also include the plural or singular number respectively. The word "or" in reference to a list of two or more items, covers all of the following interpretations of the word: any of the items in the list, all of the items in the list, and any combination of the items in the list.

The above-detailed description of embodiments of the disclosure is not intended to be exhaustive or to limit the teachings to the precise form disclosed above. While specific embodiments of and examples for the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed, at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference in their entirety. Aspects of the disclosure can be modified, if necessary, to employ the systems, functions, and concepts of the various references described above to provide yet further embodiments of the disclosure.

These and other changes can be made to the disclosure in light of the above Detailed Description of the Preferred Embodiments. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features or aspects of the disclosure with which that terminology is associated. In general, the terms used in the following claims should not be construed to limit the disclosures to the specific embodiments disclosed in the specification unless the above Detailed Description of the Preferred Embodiments section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. §112, ¶6, other aspects may likewise be embodied as a means-plus-function claim, or in other forms, such as being embodied in a computer-readable medium. (Any claims intended to be treated under 35 U.S.C. §112, ¶6 will begin with the words "means for"). Accordingly, the applicant reserves the right to add additional claims after filing the application to pursue such additional claim forms for other aspects of the disclosure.

Accordingly, although exemplary embodiments of the invention have been shown and described, it is to be understood that all the terms used herein are descriptive rather than limiting, and that many changes, modifications, and substitutions may be made by one having ordinary skill in the art without departing from the spirit and scope of the invention.

What is claimed is:

1. A protective cover for a portable electronic device and for an accessory assembly that includes a base having an accessory mounted thereto and tabs, the cover comprising:
    a main body portion which includes a rear section and a front section where the rear section and the front section are opposite to each other, wherein the front section of the main body is configured to at least partially surround and enclose the portable electronic device,
    wherein the rear section has an accessory slot defined in a recessed region of the rear section having a plurality of openings on the recessed region of the accessory slot, wherein each of the openings extend from a first surface to a second surface of the rear section of the main body to form through holes in the rear section and is configured to receive the tabs from the accessory assembly that includes the base having the accessory mounted thereto.

2. The protective cover of claim 1 wherein the openings in the rear section include a first set of two receiving openings defined therein that are positioned on opposite sides of the accessory slot, and wherein the receiving openings receive first and second tabs that extend outwardly from opposite sides of the base.

3. The protective cover of claim 2 wherein the receiving openings each include a first portion and a second portion, wherein the first and second tabs on the base define a first width from the outer edge of the first tab to the outer edge of the second tab, the first portions define a second width from the outer edge of the first portion on one side of the accessory slot to the outer edge of the first portion on the opposite side of the accessory slot, and the second portions define a third width from the outer edge of the second portion on one side of the accessory slot to the outer edge of the second portion on the opposite side of the accessory slot, wherein the second width is wider than the first width and the third width is narrower than the first width, whereby the first and second tabs can be inserted into the first portions and slid into the second portions and under the rear section.

4. The protective cover of claim 3 wherein the accessory slot includes one of a ridge or a groove and the base includes the other of a ridge or a groove, whereby the ridge is received in the groove to secure the base within the accessory slot.

5. The protective cover of claim 3 wherein the openings in the rear section include a second set of two receiving openings defined therein that are positioned on opposite sides of the accessory slot, and wherein the second set of receiving openings are adapted to receive the first and second tabs that extend outwardly from opposite sides of the base, whereby the accessory assembly is reversible.

6. The protective cover of claim 5 wherein the second set of receiving openings each include a first portion and a second portion, wherein the first and second tabs on the base define a first width from the outer edge of the first tab to the outer edge of the second tab, the first portions define a second width from the outer edge of the first portion on one side of the accessory slot to the outer edge of the first portion on the opposite side of the accessory slot, and the second portions define a third width from the outer edge of the second portion on one side of the accessory slot to the outer edge of the second portion on the opposite side of the accessory slot, wherein the second width is wider than the first width and the third width is narrower than the first width, whereby the first and second tabs can be inserted into the first portions and slid into the second portions and under the rear section.

7. The protective cover of claim 1 wherein the accessory is selected from the group consisting of a kickstand, bicycle handlebar mounting assembly, tripod mounting assembly and windshield mounting assembly.

8. A protective cover for a portable electronic device, the cover comprising:
an inner cushion enclosure adapted to at least partially surround and enclose the portable electronic device, wherein the inner cushion enclosure includes a back wall, two side walls, a top pouch and a bottom pouch that all cooperate to define an interior and a front screen opening, wherein the top pouch and the bottom pouch each include a groove defined in an outer surface thereof of the inner cushion enclosure, wherein the outer surface is opposite an inner surface of the inner cushion enclosure, wherein the inner surface of the inner cushion enclosure faces the portable electronic device when enclosed in the inner cushion enclosure,
a front shell that is received on and secured to the inner cushion enclosure, wherein the front shell includes a front section that has a front screen opening defined therein and rearwardly extending top and bottom members, wherein the top member includes a hook portion that is removably received in the groove in the top pouch and the bottom member includes a hook portion that is removably received in the groove in the bottom pouch, wherein the top member extends across the outer surface of the inner cushion enclosure to extend the hook portion to engage the groove defined in the outer surface of the top pouch, and
a back shell that includes a rear section and two forwardly extending side members that are removably secured to the front section of the front shell.

9. The protective cover of claim 8 wherein the front section of the front shell includes at least two grooves defined therein and the side members of the back shell each include at least one tab disposed thereon, wherein the grooves of the front shell cooperate with the tabs of the back shell to secure the back shell to the front shell.

10. The protective cover of claim 9 wherein the top and bottom members of the front shell include grooves defined therein that cooperate with tabs disposed on the rear section of the back shell to secure the back shell to the front shell.

11. The protective cover of claim 8 wherein the rear section of the back shell has an accessory slot defined therein, wherein the accessory slot removably receives a base having an accessory mounted thereto.

12. The protective cover of claim 11 wherein the rear section includes a first set of two receiving openings defined therein that are positioned on opposite sides of the accessory slot, and wherein the receiving openings receive first and second tabs that extend outwardly from opposite sides of the base.

13. The protective cover of claim 12 wherein the receiving openings each include a first portion and a second portion, wherein the first and second tabs on the base define a first width from the outer edge of the first tab to the outer edge of the second tab, the first portions define a second width from the outer edge of the first portion on one side of the accessory slot to the outer edge of the first portion on the opposite side of the accessory slot, and the second portions define a third width from the outer edge of the second portion on one side of the accessory slot to the outer edge of the second portion on the opposite side of the accessory slot, wherein the second width is wider than the first width and the third width is narrower than the first width, whereby the first and second tabs can be inserted into the first portions and slid into the second portions and under the rear section.

14. The protective cover of claim 13 wherein the accessory slot includes one of a ridge or a groove and the base includes the other of a ridge or a groove, whereby the ridge is received in the groove to secure the base within the accessory slot.

15. A method of assembling a protective cover for a portable electronic device, the method comprising:
providing an inner cushion enclosure adapted to at least partially surround and enclose the portable electronic device, wherein the inner cushion enclosure is made of a relatively flexible material and includes a back wall, two side walls, a top pouch and a bottom pouch that all cooperate to define an interior and a front screen opening, wherein the top pouch and the bottom pouch of the inner cushion enclosure each include a groove defined in an outer surface of the inner cushion enclosure, wherein the outer surface is opposite an inner surface of the inner cushion enclosure, wherein the inner surface of the inner cushion enclosure faces the portable electronic device when enclosed in the inner cushion enclosure,
covering the portable electronic device with the inner cushion enclosure,
providing a front shell that is made of a relatively hard material, wherein the front shell has rearwardly extending top and bottom members that each include a hook portion, securing the front shell to the inner cushion enclosure by inserting the hook section of the top member into the groove in the top pouch and inserting the hook section of the bottom member into the groove in the bottom pouch, wherein when the front shell is secured to the inner cushion enclosure, the top member extends across the outer surface of the inner cushion enclosure to extend the hook portion to engage the groove defined in the outer surface of the top pouch a portion of the outside surface of the bottom pouch to extend the hook portion to engage, and providing a back shell that is made of a relatively hard material, and securing the back shell to the front shell.

16. The method of claim 15 wherein the front section of the front shell has a front screen opening defined therein.

17. The method of claim 16 wherein the rear section of the back shell includes two forwardly extending side members that each include at least one tab disposed thereon, and the front section of the front shell includes at least two grooves defined therein, and wherein the method further comprises the step of inserting the tabs into the grooves to secure the back shell to the front shell.

18. The method of claim 15 wherein the back shell includes a rear section that has an accessory slot defined therein, and wherein the method further comprises the step of inserting an accessory assembly into the accessory slot.

* * * * *